(12) United States Patent
Gliese

(10) Patent No.: US 7,432,736 B2
(45) Date of Patent: Oct. 7, 2008

(54) LOGIC BASIC CELL

(75) Inventor: Jorg Gliese, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 10/598,775

(22) PCT Filed: Feb. 21, 2005

(86) PCT No.: PCT/DE2005/000292

§ 371 (c)(1),
(2), (4) Date: Jul. 16, 2007

(87) PCT Pub. No.: WO2005/088838

PCT Pub. Date: Sep. 22, 2005

(65) Prior Publication Data

US 2007/0279090 A1 Dec. 6, 2007

(30) Foreign Application Priority Data

Mar. 9, 2004 (DE) .................. 10 2004 011 433

(51) Int. Cl.
*G06F 7/38* (2006.01)
*H03K 19/094* (2006.01)
*H03K 19/177* (2006.01)
(52) U.S. Cl. ..................... 326/44; 326/49; 326/104
(58) Field of Classification Search ............ 326/44–45, 326/49–50, 52–55, 104, 112, 119, 121
See application file for complete search history.

(56) References Cited

U.S. PATENT DOCUMENTS

| | | | |
|---|---|---|---|
| 3,766,371 A | * | 10/1973 | Suzuki .................. 708/702 |
| 5,592,107 A | | 1/1997 | McDermott et al. |
| 5,909,386 A | * | 6/1999 | Shiraishi .................. 708/710 |
| 6,130,553 A | | 10/2000 | Nakaya |
| 6,529,040 B1 | | 3/2003 | Carberry et al. |
| 2003/0210073 A1 | | 11/2003 | Ngai et al. |
| 2005/0134317 A1 | | 6/2005 | Gliese |

FOREIGN PATENT DOCUMENTS

| | | |
|---|---|---|
| DE | 103 54 501 A1 | 6/2005 |
| DE | 103 57 209 A1 | 7/2005 |
| EP | 1 122 888 A1 | 8/2001 |

OTHER PUBLICATIONS

Kim,H. et al.; "Design of heuristic algorithms based on Shannon expansion for low-power logic circuit synthesis"; IEE Proc.-Circuits Devices Syst., vol. 144, No. 6, Dec. 1997, pp. 355-360.

(Continued)

Primary Examiner—Anh Q Tran
(74) Attorney, Agent, or Firm—Dickstein Shapiro LLP

(57) ABSTRACT

A logic basic cell contains a first logic function block and a second logic function block for the logic combination of a first input signal and a second input signal in accordance with a predeterminable first or second logic subfunction, and a first logic transistor coupled to the first logic function block, having a gate terminal, at which a third input signal can be provided, and having a source/drain terminal at which the output signal can be provided. Furthermore, a second logic transistor coupled to the second logic function block is provided, having a gate terminal, at which a complementary signal with respect to the third input signal can be provided, and having a source/drain terminal, which is coupled to the source/drain terminal of the first logic transistor.

22 Claims, 6 Drawing Sheets

OTHER PUBLICATIONS

Wannemacher, M; "Das FPGA-Kochbuch"; ("The FPGA Cookbook"); figure 6.4: SRAM cell from XILINX, 1st edition, International Thomson Publishing Company, Bonn, 1998, p. 111, no month.

Wannemacher, M; "Das FPGA-Kockbuch" (The FPGA Cookbook); figure 7.36; logic block (CLB) of the XC4000 families, 1st edition, International Thomson Publishing Company, Bonn, 1998, p. 197, no month.

* cited by examiner

| $S_3$ | $S_2$ | $S_1$ | $S_0$ | $y_T$ |
|---|---|---|---|---|
| 0 | 0 | 0 | 0 | 1 |
| 0 | 0 | 0 | 1 | [OR] |
| 0 | 0 | 1 | 0 | $a_0 \vee \bar{a}_1$ |
| 0 | 0 | 1 | 1 | $a_0$ |
| 0 | 1 | 0 | 0 | $\bar{a}_0 \vee a_1$ |
| 0 | 1 | 0 | 1 | $a_1$ |
| 0 | 1 | 1 | 0 | [XNOR] |
| 0 | 1 | 1 | 1 | [AND] |
| 1 | 0 | 0 | 0 | [NAND] |
| 1 | 0 | 0 | 1 | [XOR] |
| 1 | 0 | 1 | 0 | $\bar{a}_1$ |
| 1 | 0 | 1 | 1 | $a_0 \wedge \bar{a}_1$ |
| 1 | 1 | 0 | 0 | $\bar{a}_0$ |
| 1 | 1 | 0 | 1 | $\bar{a}_0 \wedge a_1$ |
| 1 | 1 | 1 | 0 | [NOR] |
| 1 | 1 | 1 | 1 | 0 |

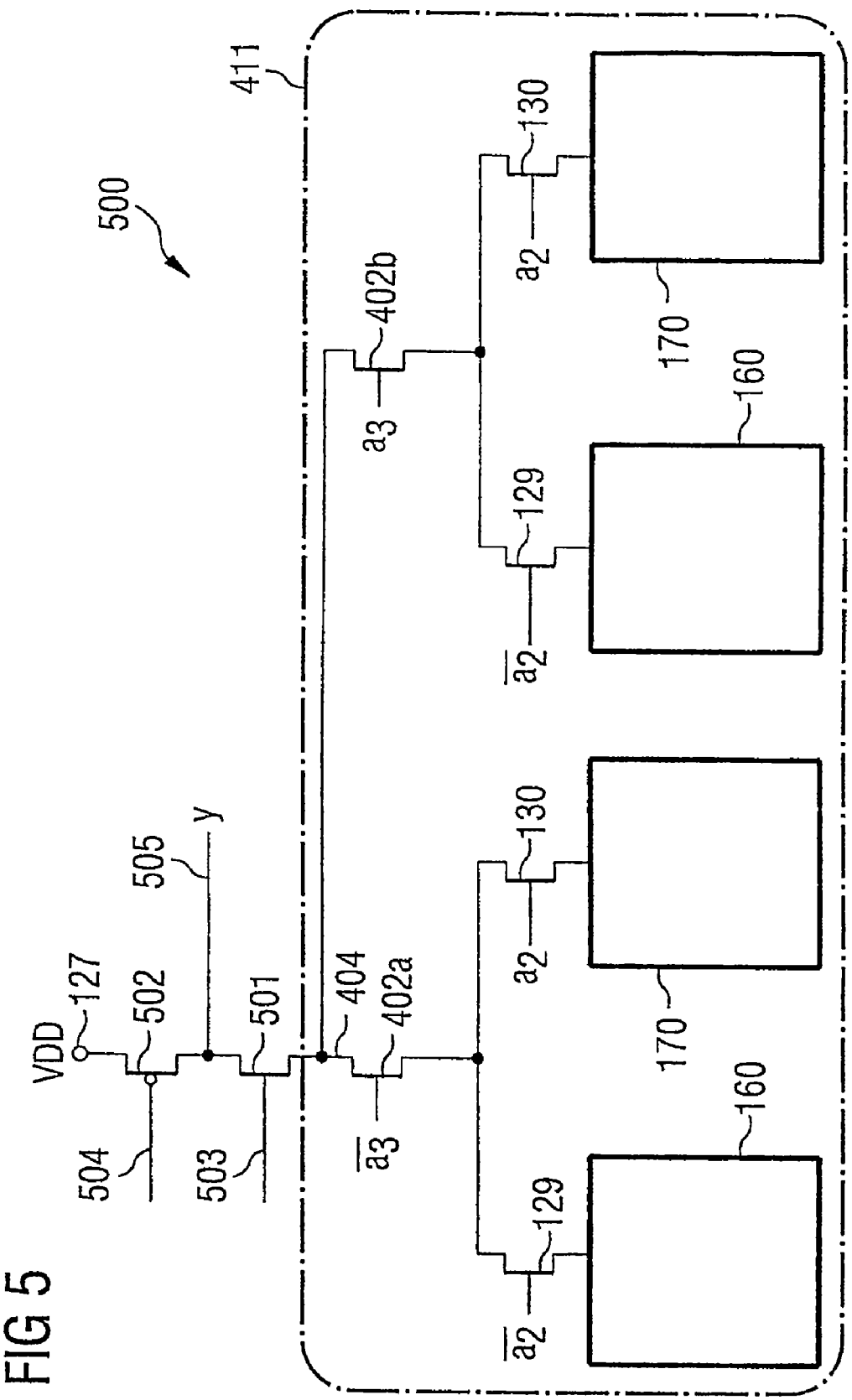

ary Publishing
LOGIC BASIC CELL

FIELD OF THE INVENTION

The invention relates to a logic basic cell, a logic basic cell array and a logic device.

BACKGROUND OF THE INVENTION

The advent of digital technology and the rapid development of microprocessor technology gave rise to a demand for programmable logic. A PLD ("programmable logical device") is an integrated circuit whose logic function is defined by the user by means of programming. A PLD is an architecture for digital logic operations with a plurality of switches that enable a multiplicity of signal paths. The logic function assigned to a PLD in a user-specific fashion is defined by means of the configuration of the PLD.

PLDs include, inter alia, field-programmable gate arrays (FPGAs), the functionality of which can be assigned to them by the user, and mask-programmable gate arrays (MPGAs, also called "structured ASICs"), which can be allocated a logic function by means of hardware configuration. Via-programmable gate arrays (VPGAs) belong among MPGAs.

A digital logic cell maps n input signals onto an output signal. The number of possible mapping functions is $2^{2^n}$. A circuit group as a digital logic cell is realized in accordance with the prior art by using so-called look-up tables (LUT), for example. For this purpose, function values of the logic function are set by means of a data word of $2^n$ bits. In other words, the respectively selected logic function is coded into a data word. n input signals $a_0, a_1, \ldots, a_{n-1}$ are combined with one another in accordance with the selected logic function. Consequently, the logic input signals of the logic function $y=f(a_0, a_1, \ldots, a_{n-1})$ may be regarded as a binary address and converted into a one-hot coding in order to select the function value subsequently by means of pass gate logic. Such a method is disclosed in Wannemacher, M "Das FPGA-Kochbuch" ["The FPGA cookbook"], FIG. 6.4: SRAM cell from XILINX, 1st edition, International Thomson Publishing Company, Bonn, 1998, page 111, for example.

As an alternative, the inputs may serve as control inputs for a multiplexer tree, see Wannemacher, M "Das FPGA-Kochbuch" ["The FPGA cookbook"], FIG. 7.36: logic block (CLB) of the XC4000 families, 1st edition, International Thomson Publishing Company, Bonn, 1998, page 197. The multiplexers may be realized in a logic-based manner and/or on the basis of transmission gates.

U.S. Pat. No. 6,529,040 B1 discloses an FPGA on the basis of a look-up table (LUT).

The logic basic cells using a look-up table which are disclosed in the prior art have disadvantages with regard to switching speed and/or interference immunity. The known solutions furthermore cannot be realized sufficiently compactly in terms of layout for many applications. Therefore, continued scaling is possible only with difficulty using the LUT solutions disclosed in the prior art.

As an alternative to the known LUT architectures, the prior art discloses interconnections comprising individual logic gates which can be used to form a desired logic function. However, such an architecture is restricted to the formation of a very specific logic function, whereas the overall scope of all possible logic mapping functions can only be realized in a very complicated manner using predetermined logic gates. The complicated logic gates are restricted with regard to the achievable switching speed, too. The limitation of the scope of the possible logic functions considerably complicates the automatic logic partitioning in the case of an FPGA design.

Another approach consists in making complex logic gates, which realize a combination of a plurality of logic inputs, flexibly interconnectable and in accomplishing a complete or almost complete coverage of the combinatorial function space through skillful combination of fewer than the possible inputs. However, such a realization has the disadvantage that flexibility outside the cell is used for the internal logic configuration of the cell and is thus limited. Moreover, the functional mapping is generally complicated.

Furthermore, U.S. Pat. No. 5,592,107 discloses a configurable NAND/NOR element.

SUMMARY OF THE INVENTION

The invention is based on the problem, in particular, of providing a logic basic cell which can be produced with a tenable outlay in respect of area and has a sufficiently good signal processing speed.

The problem is solved by means of a logic basic cell, by means of a logic basic cell array and by means of a logic device.

A logic basic cell contains a first logic function block and a second logic function block for the logic combination of a first input signal and a second input signal in accordance with a predeterminable first or second logic subfunction, and a first logic transistor coupled to the first logic function block, having a gate terminal, at which a third input signal can be provided, and having a source/drain terminal at which the output signal can be provided. Furthermore, a second logic transistor coupled to the second logic function block is provided, having a gate terminal, at which a complementary signal with respect to the third input signal can be provided, and having a source/drain terminal, which is coupled to the source/drain terminal of the first logic transistor.

BRIEF DESCRIPTION OF THE DRAWINGS

Exemplary embodiments of the invention are illustrated in the figures and are explained in more detail below.

In the figures:

FIG. 2 shows a table illustrating the correlation between values of four logic selection signals and a logic function that is realized by the logic basic cell in accordance with FIG. 1.

FIG. 5 shows a logic basic cell array in accordance with a second exemplary embodiment of the invention.

Identical or similar components in different figures are provided with identical reference numerals.

Figure 1:
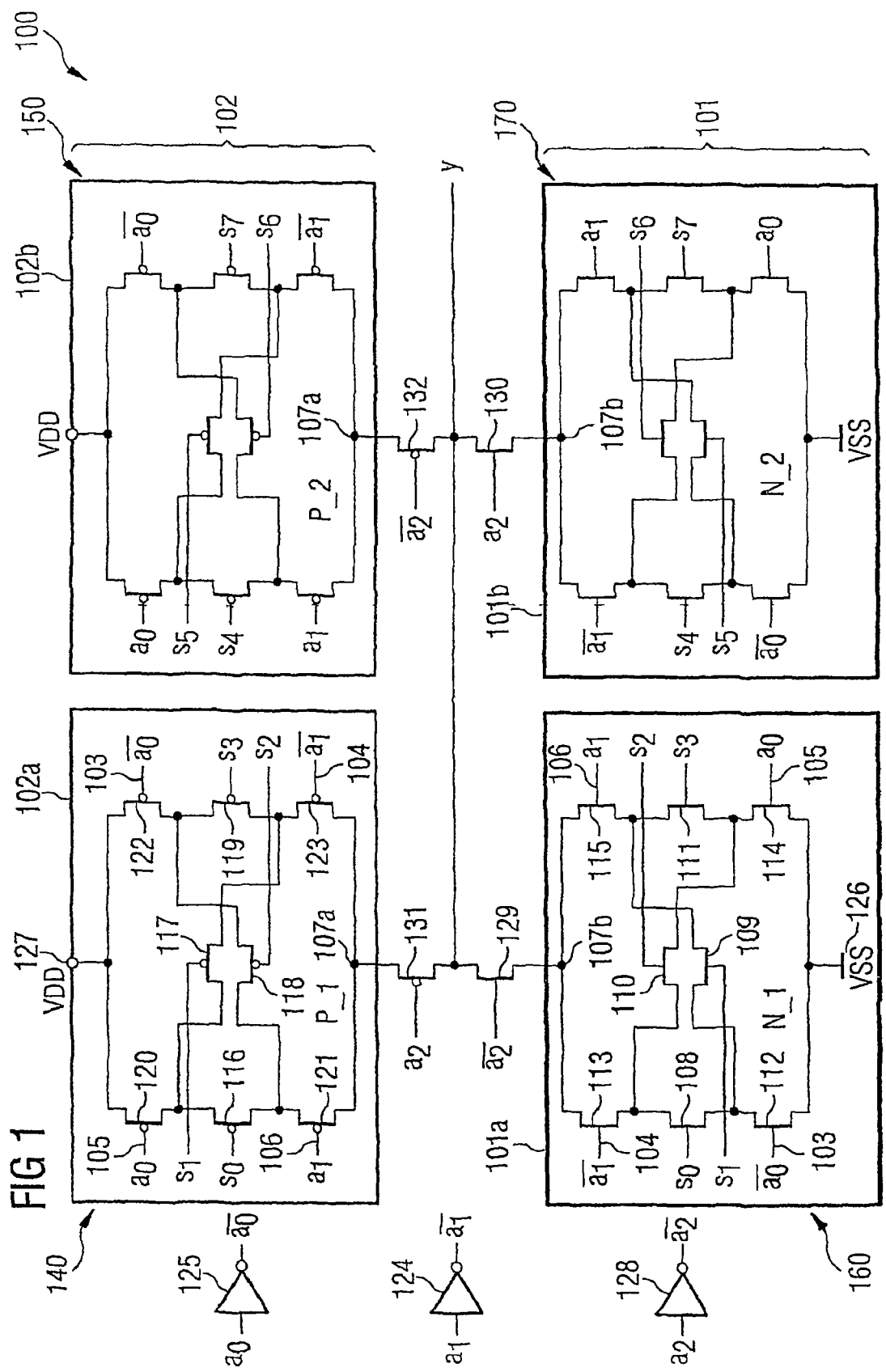
FIG. 1 shows a logic basic cell in accordance with one exemplary embodiment of the invention.

The illustration in the figures is schematic and not to scale.

DETAILED DESCRIPTION OF PREFERRED EMBODIMENTS OF THE INVENTION

The logic basic cell according to the invention for forming an output signal from at least three input signals in accordance with a predeterminable logic function contains a first logic function block having two data signal inputs, to which a first input signal and a second input signal can be applied, and having a data signal output for providing a logic combination of the first input signal and the second input signal in accordance with a predeterminable first logic subfunction. Furthermore, the logic basic cell contains a second logic function block having two data signal inputs, to which the first input signal and the second input signal can be applied, and having a data signal output for providing a logic combination of the first input signal and the second input signal in accordance with a predeterminable second logic subfunction. Furthermore, a first logic transistor is provided having a first source/drain terminal, which is coupled to the data signal output of the first logic function block, having a gate terminal, at which a third input signal can be provided, and having a second source/drain terminal, at which the output signal can be provided. Furthermore, a second logic transistor is provided having a second source/drain terminal, which is coupled to the data signal output of the second logic function block, having a gate terminal, at which a complementary signal with respect to the third input signal can be provided, and having a second source/drain terminal, which is coupled to the second source/drain terminal of the first logic transistor.

The logic basic cell array according to the invention for forming an output signal from at least four input signals in accordance with a predeterminable logic function contains a first logic basic cell having the features described above. Furthermore, a third logic transistor is provided having a first source/drain terminal, to which the output signal of the first logic basic cell can be applied, having a gate terminal, at which a fourth input signal can be provided, and having a second source/drain terminal, at which the output signal of the logic basic cell array can be provided. Furthermore, the logic basic cell array contains a second logic basic cell having the features described above. Furthermore, a fourth logic transistor is provided having a first source/drain terminal, to which the output signal of the second logic basic cell can be applied, having a gate terminal, at which a complementary signal with respect to the fourth input signal can be provided, and having a second source/drain terminal, which is coupled to the second source/drain terminal of the third logic transistor.

Furthermore, the invention provides a logic device for forming a logic combination of more than four data signals, which has a plurality of logic basic cell arrays having the features described above.

One basic idea of the invention is based on combining, in a logic basic cell, two logic combinations of a first number of input signals generated by means of two logic function blocks with one another in an advantageous manner such that a more complex logic function of a larger number of input signals is realized with little hardware outlay. A complex logic function to be realized is clearly reduced to simpler logic subfunctions on the basis of so-called Shannon decomposition, and this is done in a particularly simple manner in terms of circuitry by means of two logic transistors.

By means of the Shannon decomposition represented in equation (1), a logic function $y(a_0,a_1,a_2)$ of three input signals $a_0$, $a_1$, $a_2$, for example, can be decomposited into two logic subfunctions $y_0(a_1,a_0)$, $y_1(a_1,a_0)$, which logic subfunctions no longer depend on one input signal. The formation of the function y from $y_0$ and $y_1$ is effected using the third input signal $a_2$ and the logically complementary signal $\overline{a_2}$ with respect thereto:

$$y(a_2,a_1,a_0) = \overline{a_2} \cdot y_0(a_1,a_0) \vee a_2 \cdot y_1(a_1,a_0) \tag{1}$$

When generalized to a function f of n input signals, which is reduced to two subfunctions $f_0$, $f_1$ having (n−1) input signals in each case, the following results:

$$f(a_n,a_{n-1},\ldots,a_1,a_0) = \overline{a_n} \cdot f_0(a_{n-1},\ldots,a_0) \vee a_n \cdot f_1(a_{n-1},\ldots,a_0) \tag{2}$$

Clearly, a proposition of Boolean logic is used as a basis for a circuit architecture which is realized in the logic basic cell according to the invention. The function $f(a_n, a_{n-1}, \ldots, a_0)$ of n+1 input signals $a_i$ can be reduced in accordance with the Boolean logic in accordance with equation (2) to two functions $f_0$, $f_1$ of n input signals $a_i$ in each case.

For the case n=2, that is to say for a function of n+1=3 input signals, the overall logic function f as a function of three input signals is thus reduced to two logic subfunctions $f_0$ and $f_0$ each of two input signals. Each of the logic subfunctions $f_0$, $f_1$ can be realized by one of the logic function blocks of a logic basic cell.

According to the invention, the reduction of a function f of in general n variables to two functions having (n−1) variables in each case is realized by connecting up the first and second logic transistors to the data signal outputs of the first and second logic function blocks in the manner described. This realization constitutes an implementation of equation (1) or (2) which is particularly advantageous in terms of circuitry and in which a small number of transistors used are combined with a high signal processing speed and a small area requirement on a semiconductor wafer.

Clearly, in a first logic function block having an arbitrary construction, the logic function $y_0(a_1,a_0)$ (or generally $f_0$ in accordance with equation (2)) is realized by providing the input signals $a_0$, $a_1$ at the inputs of the first logic function block and setting up the logic function block with regard to its functionality in such a way that it realizes the logic function $y_0$. Furthermore, in a second logic function block, the function $y_1(a_1,a_0)$ (or generally $f_1$ in accordance with equation (2)) is realized by providing the data signals $a_1$, $a_0$ at the inputs of the second logic function block and providing the output signal $y_1(a_1,a_0)$ at the output of the second logic function block. Using only two transistors, namely the first and the second logic transistors, the logic function values $y_0$, $y_1$ (or generally $f_0$, $f_1$ in accordance with equation (2)) formed in accordance with the logic subfunctions that can be selected are combined with a third data signal $a_2$ and with the logically complementary signal $\overline{a_2}$ with respect thereto in such a way that the overall function y or f is realized in accordance with equation (1) or (2), respectively. This combination can be realized with only two additional field effect transistors according to the invention, with the result that an extremely favorable coupling of the data signals $a_0$, $a_1$, $a_2$ in terms of circuitry is made possible.

Clearly, the invention avoids the use of an explicit multiplexer for coupling the logic subfunctions $y_0$, $y_1$ to the third data signal $a_2$ and the logically complementary signal $\overline{a_2}$ thereof. The functionality of a multiplexer is clearly fulfilled by the two logic transistors.

To put it another way, the invention makes it possible to realize functions of more than two input signals with a small number of transistors, an explicit multiplexer being dispensable, so that only an optimally small number of transistors is required.

One important aspect of the invention consists in arranging or connecting up the third (or a fourth or additional) switching variable in a transistor series path in such a way that the input having the highest significance directly switches the output.

The logic basic cell according to the invention or the logic basic cell array based thereon makes it possible to reduce logic functions having high complexity to logic functions having lower complexity for the purpose of better processability, and to realize this with an extremely advantageous arrangement of transistors in terms of circuitry which require only a small area on a chip and ensure fast processing of the signals to be combined.

To put it another way, according to the invention, by means of an interconnection of logic basic cells with one another, an arbitrary, complicated overall logic function that is dependent on a multiplicity of input signals can be reduced to a plurality of simpler logic subfunctions of a smaller number of input signals. The solution according to the invention is based on Boolean logic and realizes this in an advantageous, preferably semiconductor-technological circuit architecture.

The selection of a logic subfunction (for example AND combination, OR combination, exclusive-OR combination, NAND combination, NOR combination, exclusive-NOR combination, etc.) of a logic function block may be effected for example by means of the configuration of logic function configuration inputs of the respective logic function block. In the circuitry realization, a logic function block may have transistors connected to one another, in which case, by means of the application of logic function signals to logic function configuration inputs of the logic function blocks, it is possible to activate specific paths within the transistor network, so that it is possible to process input signals in accordance with these selected paths in accordance with a predeterminable logic function.

In the case of the logic basic cell according to the invention, the first logic function block and the second logic function block may in each case have at least one additional data signal input, it being possible for an additional input signal to be applied to each of the additional data signal inputs, whereby the logic basic cell is set up for forming an output signal from at least four input signals in accordance with a predeterminable logic function. To put it another way, in accordance with this configuration, more than two input signals are applied to each of the logic function blocks, so that the corresponding logic function block realizes a logic subfunction of at least three input signals. Consequently, the logic basic cell according to the invention is not restricted to the combination of a total of three data signals with one another, but rather can be operated in accordance with equation (2) with an arbitrary number of data or input signals. This enables even very complex combinations of many data signals.

The first logic function block and the second logic function block may in each case be formed from a plurality of data signal transistors that are connected to one another in accordance with the respective logic subfunction. Consequently, the logic basic cell can be constructed entirely from transistors (preferably field effect transistors) and therefore be produced by the mature methods of silicon microelectronics.

The logic transistors and the data signal transistors may be transistors of a first conduction type, and the transistors of the first conduction type may form a first data signal path. Furthermore, a second data signal path may be formed from transistors of a second conduction type, which is complementary to the first conduction type, in which case, for each of the transistors of the first data signal path, a correspondingly connected transistor is provided in the second data signal path. The second source/drain terminals of the logic transistors of the first data signal path and the second source/drain terminals of the logic transistors of the second data signal path may be coupled to one another in the logic basic cell according to the invention.

The transistors of the first conduction type may be transistors of the n conduction type, for example, whereas the transistors of the second conduction type may be transistors of the p conduction type, or vice versa. Consequently, the logic basic cell according to the invention may be formed using a CMOS architecture, for example.

The logic basic cell according to the invention may be provided with an evaluation switch, to which the output signal can be applied, and with a precharge switch, which switches are connected and can be controlled in such a way that the output signal is provided at an output of the logic basic cell when the evaluation switch is open (that is to say permits signal transfer) and the precharge switch is closed (that is to say does not permit signal transfer). Furthermore, a reference signal can be provided at the output of the logic basic cell when the precharge switch is open (that is to say permits signal transfer) and the evaluation switch is closed (that is to say does not permit signal transfer). The evaluation switch and the precharge switch may be transistors in each case, in particular field effect transistors or bipolar transistors.

In accordance with this configuration, the output can be precharged to the reference potential by means of the precharge switch (precharge phase), for example during the first half of a switching period of the logic basic cell. By means of the evaluation switch, the output signal processed in accordance with the predetermined logic function can be provided at the output, for example during the second half of the switching period of the logic basic cell (evaluation phase).

The logic basic cell according to the invention may be set up as a CMOS logic basic cell.

In accordance with one configuration of the invention, at least one of the logic function blocks may be formed in the structure of a programmable logic device (PLD), a field-programmable gate array (FPGA), a mask-programmed application specific integrated circuit (mASIC), a logic gate or an arrangement of a plurality of logic gates or a look-up table. According to the invention, it is possible, in principle, to choose any desired configuration for the logic function blocks. In the case of the configuration of a logic function block as a look-up table, it is possible here by way of example, to implement the architecture disclosed in U.S. Pat. No. 6,529,040 B1 in the logic basic cell of the invention. In the case of the realization of a logic function block as a mask-programmed application specific integrated circuit or as a "structured ASIC", a desired logic subfunction of a logic function block can be realized by means of hardwiring of transistors within the logic function block. In other words, using vias or other fixedly implemented coupling elements, a specific signal path or a plurality of signal paths may be permitted within the transistor arrangement of such a 'structured ASIC', as a result of which a fixed logic function is permanently assigned to the logic function block.

The logic subfunction that can be realized may be predetermined in an invariable manner at at least one logic configuration input of at least one of the logic function blocks. In accordance with this configuration, the logic function block always performs the logic subfunction allocated fixedly and invariably to it, since the logic subfunction is fixedly set by means of the application of predetermined signals (or operating voltages) to the logic configuration inputs. The predetermined logic subfunction can also be realized in hardwired fashion by means of short-circuiting or corresponding hardwired coupling of the transistors of the logic function block. It is then possible for predetermined electrical potentials (for example operating voltage, ground potential) to be applied to the transistors connected to one another in a defined manner via one or a plurality of terminals of the logic function block. Given a fixedly predetermined logic subfunction of a logic function block, provision may be made of a memory device which is coupled to the at least one logic configuration input and in which the information for predetermining the logic subfunction that can be realized can be stored. Consequently, such a memory device can store a data word in which the logic subfunction of the logic function block is coded, for example as a binary data word.

As an alternative to the configuration described, the logic subfunction that can be realized may be predetermined in a variable manner at at least one logic function configuration input of a respective logic function block by means of a signal that can be applied. In the case of this configuration of the logic function block, the latter can carry out any desired logic function which is predetermined for the logic basic cell by means of a (for example temporally) variable electrical potential at control inputs of transistors within the logic function block. In this scenario, the logic function block may be connected as a variable logic component of the superordinate logic basic cell or of the logic basic cell array superordinate thereto, which enables a flexible circuit architecture.

The logic basic cell according to the invention is preferably set up for processing digital data signals having a logic value "1" or "0".

In accordance with one preferred exemplary embodiment of the logic basic cell according to the invention, at least one of the logic function blocks furthermore has a first complementary data signal input, to which the logically complementary signal with respect to the first input signal can be applied, and has a second complementary data signal input, to which the logically complementary signal with respect to the second input signal can be applied. A first logic selection element is formed between the first data signal input and the second data signal input. A second logic selection element is formed between the first data signal input and the second complementary data signal input. A third logic selection element is formed between the second data signal input and the first complementary data signal input. A fourth logic selection element is formed between the first complementary data signal input and the second complementary data signal input. The logic combination of the two data signals in accordance with the logic function selected by means of the logic selection elements can be provided at the data signal output.

In accordance with this configuration, at least one of the logic function blocks of the logic basic cell is provided in a circuitry realization such that a complete mapping of the combinatorial function space by way of n inputs is achieved in conjunction with a very small number of required components (for example transistors). In other words, this configuration of the logic function blocks makes it possible to realize any possible logic combination of two data signals in an optimized interconnection of logic selection elements and data signal inputs. In combination with the logic transistors of the logic basic cell, an extremely efficient combination of three data signals in terms of circuitry can be made possible. Clearly, the logic selection elements of the logic function block are configured in such a way that they determine the logic function realized by the logic basic cell according to the invention. This may be achieved for example by means of a hardwired realization of the logic selection elements, so that, in this case, the logic function is determined by means of the invariable wiring of the data signal inputs that is predetermined by the logic selection elements. As an alternative, the logic selection elements may be provided for example as logic selection transistors, the logic function to be realized being predetermined by means of applying logic selection signals to the gate terminals of the logic transistors.

This architecture of a logic function block constitutes a very simple arrangement which enables any possible logic function of two inputs to be realized with a very low circuitry outlay. The particularly compact realization of the logic function blocks in accordance with the configuration described saves chip area and thus enables a miniaturized realization of the logic basic cell.

The logic selection elements may be invariable hardware elements. In accordance with this realization, the desired logic function is fixedly predetermined once, to be precise by means of wiring the four data signal inputs in a predetermined manner. The predetermined coupling between the individual data signals that are provided at the data signal inputs is predetermined by the interconnection of the logic selection elements and thus leads to an unambiguous logic function.

In accordance with the configuration described, the logic selection elements may be realized by means of a plurality of metallization planes and/or vias.

In the case of the logic function block in accordance with the described configuration of the invention, the first logic selection element may be a first logic transistor, which can be controlled by means of a first logic selection signal. The second logic selection element may be a logic transistor which can be controlled by means of a second logic selection signal. The third logic selection element may be a third logic transistor, which can be controlled by means of a third logic selection signal. The fourth logic selection element may be a fourth logic transistor, which can be controlled by means of a fourth logic selection element. In accordance with this configuration, four logic selection signals are applied to the logic transistors, preferably to the gate terminals thereof, thereby realizing a very specific coupling of the data signals at the data signal inputs. The logic function that is realized is predetermined in accordance with this specific coupling, which can be predetermined in a variable manner.

Furthermore, the logic function block in accordance with the configuration described may have four data signal transistors, at the gate terminals of which in each case one of the data signals or the logically complementary data signals can be provided. In the case of this configuration, the four data signals, that is to say the first data signal and the logically complementary data signal with respect thereto and also the second data signal and the logically complementary data signal with respect thereto, are coupled into the logic function block via gate terminals of four data signal transistors.

In accordance with the configuration described, a first data signal transistor may be connected in such a way that a first source/drain terminal is coupled to a first source/drain terminal of the first logic transistor and to a second source/drain terminal of the second logic transistor. Furthermore, the second source/drain terminal of the second data signal transistor may be coupled to a first source/drain terminal of a third data signal transistor.

The third data signal transistor may be connected in such a way that its second source/drain terminal is coupled to a first source/drain terminal of the fourth logic transistor and to a first source/drain terminal of the second logic transistor.

A second data signal transistor may be connected in such a way that its first source/drain terminal is coupled to a second source/drain terminal of the first logic transistor and to a second source/drain terminal of the third logic transistor. A second source/drain terminal of the first data signal transistor may be coupled to a first source/drain terminal of a fourth data signal transistor. The fourth data signal transistor may be connected in such a way that its second source/drain terminal is coupled to a second source/drain terminal of the third logic transistor and to a second source/drain terminal of the fourth logic transistor.

The described interconnection of the four data signal transistors with the four logic transistors provides a preferred circuitry realization of a logic function block of a logic basic cell for realizing a possible logic function for combination of the data signals, and this with a very low circuitry outlay.

Even though configurations of the logic basic cell have been described, these configurations are nevertheless also intended to apply to the logic basic cell array according to the invention and to the logic device according to the invention.

A description is given below, with reference to FIG. 1, of a logic basic cell 100 in accordance with one exemplary embodiment of the invention.

The logic basic cell 100 has a first data signal path 101 comprising n-MOS transistors and a second data signal path 102 comprising p-MOS transistors. The first data signal path 101 contains a first logic function block 160 and a second logic function block 170. The second data signal path 102 contains a first logic function block 140 and a second logic function block 150.

The structure of the first logic function block 160 of the first data signal path 101 is described in more detail below.

The first logic function block 160 of the first data signal path 101 has a first data signal input 103, at which a first complementary data signal $\overline{a_0}$, which is complementary with respect to the first data signal $a_0$, is provided. Furthermore, a second complementary data signal $\overline{a_1}$, which is complementary with respect to a second data signal $a_1$, is provided at a second data signal input 104. The first data signal $a_0$ is provided at a third data signal input 105. Furthermore, the second data signal $a_1$ is provided at a fourth data signal input 106.

An output signal of the first logic function block 160, that is to say a logic combination of the first input signal $a_0$, $\overline{a_0}$ and the second input signal $a_1$, $\overline{a_1}$ in accordance with a predeterminable logic subfunction, is provided at a data signal output 107b of the first logic function block 160 of the first data signal path 101.

A first n-MOS logic selection transistor 108 is provided as a first logic selection element between the first data signal input 103 and the second data signal input 104. The first n-MOS logic selection transistor 108 can be controlled by means of a first logic selection signal $s_0$. Furthermore, a second n-MOS logic selection transistor 109 is provided as a second logic selection element between the first data signal input 103 and the fourth data signal input 106. The second n-MOS logic selection transistor 109 can be controlled by means of a second logic selection signal $s_1$. Furthermore, a third n-MOS logic selection transistor 110 is provided as third logic selection element between the second data signal input 104 and the third data signal input 105, which third n-MOS logic selection transistor 110 can be controlled by means of a third logic selection signal $s_2$. A fourth n-MOS logic selection transistor 111 is connected as a fourth logic selection element between the third data signal input 105 and the fourth data signal input 106, which fourth n-MOS logic selection transistor 111 can be controlled by means of a fourth logic selection signal $s_3$.

The first data signal input 103 is coupled to the gate region of a first n-MOS data signal transistor 112. The second data signal input 104 is coupled to the gate region of a second n-MOS data signal transistor 113. The third data signal input 105 is coupled to the gate region of a third n-MOS data signal transistor 114. The fourth data signal input 106 is coupled to the gate region of a fourth n-MOS data signal transistor 115.

The first n-MOS data signal transistor 112 is connected in such a way that its first source/drain terminal is coupled to a first source/drain terminal of the first n-MOS logic selection transistor 108 and to a first source/drain terminal of the second n-MOS logic selection transistor 109. A second source/drain terminal of the n-MOS data signal transistor 112 is coupled to a first source/drain terminal of the third n-MOS data signal transistor 114, and is brought to the electrical supply potential 126. The third n-MOS data signal transistor 114 is connected in such a way that its second source/drain terminal is coupled to a first source/drain terminal of the fourth n-MOS logic selection transistor 111 and to a first source/drain terminal of the third n-MOS logic selection transistor 110. The second n-MOS data signal transistor 113 is connected in such a way that its first source/drain terminal is coupled to a second source/drain terminal of the first n-MOS logic selection transistor 108 and to a second source/drain terminal of the third n-MOS logic selection transistor 110. A second source/drain terminal of the second n-MOS data signal transistor 113 is coupled to a first source/drain terminal of the fourth n-MOS data signal transistor 115. The fourth n-MOS data signal transistor 115 is connected in such a way that its second source/drain terminal is coupled to a second source/drain terminal of the second n-MOS logic selection transistor 109 and to a second source/drain terminal of the fourth n-MOS logic selection transistor 111. The second source/drain terminal of the second n-MOS data signal transistor 113 and the first source/drain terminal of the fourth n-MOS data signal transistor 115 are coupled to the data signal output 107b.

The complementary data signal $\overline{a_1}$ with respect to the second data signal $a_1$ can be generated from the second data signal $a_1$ by means of a first inverter 124. The complementary data signal $\overline{a_0}$ with respect to the first data signal $a_0$ can be generated from the first data signal $a_0$ by means of a second inverter 125. The complementary data signal $\overline{a_2}$ with respect to the third data signal $a_2$ can be generated from the third data signal $a_2$ by means of a third inverter 128.

In accordance with the exemplary embodiment described, the second logic function block 170 of the first data signal path 101 is constructed completely identically to the first logic function block 160 of the first data signal path 101. However, the logic subfunction that is realized by means of the second logic function block 170 may differ from the logic subfunction that is realized by means of the first logic function block 160. This is identified in FIG. 1 by the fact that logic selection signals $s_4$ to $s_7$ of the second logic function block 170 of the first data signal path 101 are designated differently than the logic function signals $s_0$ to $s_3$ of the first logic function block 160. Consequently, an arbitrary logic combination of the input signals $a_0$, $a_1$, $\overline{a_0}$, $\overline{a_1}$ can be realized independently of one another in each of the logic function blocks 160, 170.

Furthermore, a first n-MOS logic transistor 129 is provided having a first source/drain terminal, which is coupled to the data signal output 107b of the first logic function block 160, having a gate terminal, at which is provided a third complementary input signal $\overline{a_2}$, which is complementary with respect to a third data signal $a_2$, and having a second source/drain terminal, at which is provided the output signal of the logic basic cell 100 formed from the three input signals $a_0$, $a_1$, $a_2$ and also the logically complementary signals $\overline{a_0}$, $\overline{a_1}$, $\overline{a_2}$ thereof in accordance with a predetermined logic function. Furthermore, a second n-MOS logic transistor 130 is provided in the logic basic cell 100, having a first source/drain terminal, which is coupled to the first data signal output 107b of the second logic function block 170, having a gate terminal, at which the third data signal $a_2$ can be provided, and having a second source/drain terminal, which is coupled to the second source/drain terminal of the first n-MOS logic transistor 129.

The construction of the second data signal path 102 is described below.

This path is connected antisymmetrically with respect to the first data signal path 101, so that a first logic function block 140 and a second logic function block 150 are likewise provided in the second data signal path 102. Instead of a first n-MOS logic selection transistor 108, a first p-MOS logic selection transistor 116 is provided in the second data signal path 102. The second n-MOS logic selection transistor 109 is replaced by a second p-MOS logic selection transistor 117. The third n-MOS logic selection transistor 110 is replaced by a third p-MOS logic selection transistor 118. The fourth n-MOS logic selection transistor 111 is replaced by a fourth p-MOS logic selection transistor 119. The first n-MOS data signal transistor 112 is replaced by a first p-MOS data signal transistor 120. The second n-MOS data signal transistor 113 is replaced by a second p-MOS data signal transistor 121. The third n-MOS data signal transistor 114 is replaced by a third p-MOS data signal transistor 122. The fourth n-MOS data signal transistor 115 is replaced by a fourth p-MOS data signal transistor 123. The signal at the gate terminals of the data signal transistors 120 to 123 is the respective inverted signal compared with the signals at the gate terminals of the data signal transistors 112 to 115 of the n-MOS data signal path 101. Thus, $a_0$ is present at the gate of the first p-MOS data signal transistor 120, whereas $\overline{a_0}$ is present at the gate of the first n-MOS data signal transistor 112. $a_1$ is present at the gate of the second p-MOS data signal transistor 121, whereas $\overline{a_1}$ is present at the gate of the second n-MOS data signal transistor 113. $\overline{a_0}$ is present at the gate of the third p-MOS data signal transistor 122, whereas $a_0$ is present at the gate of the third p-MOS data signal transistor 114, and $\overline{a_1}$ is present at the gate of the fourth p-MOS data signal transistor 123, whereas $a_1$ is present at the gate of the fourth n-MOS data signal transistor 115.

Asymmetry of the two data signal paths 101, 102 is to be understood to mean that although the arrangement thereof with respect to one another is essentially mirror-symmetrical, the conduction types of the mutually corresponding transistors are complementary to one another, and the data signals at the inputs of mutually corresponding data signal transistors are likewise complementary to one another. The logic selection signals at the inputs of mutually corresponding logic selection transistors are identical in the two data signal paths 101, 102, however.

The source/drain terminals—coupled to one another—of the first p-MOS data signal transistor 120 and of the third p-MOS data signal transistor 122 are brought to the supply potential 127. Furthermore, the source/drain terminals—coupled to one another—of the second p-MOS data signal transistor 121 and of the fourth p-MOS data signal transistor 123 are coupled to a data signal output 107a. An output signal corresponding to a processing of the input signals $a_0$, $a_1$ within the logic function block 140 in accordance with the logic subfunction predetermined therein is provided at the data signal output 107a of the first logic function block 140. A first p-MOS logic transistor 131 has a first source/drain terminal, which is coupled to the data signal output 107a of the first logic function block 140, a gate terminal, to which the third input signal $a_2$ is applied, and a second source/drain terminal, at which the output signal of the logic basic cell 100 can be provided. Furthermore, a second p-MOS logic transistor 132 is provided having a first source/drain terminal, which is coupled to the data signal output 107a of the second logic function block 150 of the second data signal path 102, having a gate terminal, at which the complementary signal $\overline{a_2}$ with respect to the third input signal $a_2$ can be provided, and having a second source/drain terminal, which is coupled to the second source/drain terminal of the first p-MOS logic transistor 131.

Consequently, an output signal y corresponding to the combination of the three input signals $a_0$, $a_1$, $a_2$ and also the logically complementary signals $\overline{a_0}$, $\overline{a_1}$, $\overline{a_2}$ thereof in accordance with a predeterminable logic function is provided at the second source/drain terminals of the logic selection transistors 128 to 132.

The logic basic cell 100 constitutes a realization of an optimized logic basic cell of three inputs $a_0$, $a_1$, $a_2$ using static standard CMOS circuitry. By means of predetermining the first to fourth logic selection signals $s_0$ to $s_3$, it is clearly predetermined in the first logic function blocks 140, 160 of the first and second data signal paths 101, 102 which logic subfunction is to be realized by the logic function blocks 140, 160. By means of predetermining the first to fourth logic selection signals $s_0$ to $s_3$, it is thus defined whether the channel regions of the logic selection transistors 108 to 111 and 116 to 119, respectively, are conducting or nonconducting. As a result, specific signal paths within the logic function blocks 140, 160 are permitted, and others are precluded. This leads to a defined combination of the input signals $a_0$, $a_1$, $\overline{a_0}$, $\overline{a_1}$ in accordance with a logic subfunction, which is defined by means of predetermining the logic selection signals $s_0$ to $s_3$.

Corresponding conducting transistor paths are predetermined in a similar manner by means of predetermining the fifth to eighth logic selection signals $s_4$ to $s_7$ in the second logic function blocks 150, 170, so that a predeterminable logic subfunction of the two input variables $a_0$, $a_1$ can also be realized therein.

The combination of the output signals of the logic function blocks 140, 150, 160, 170 with the third data signal $a_2$ and the logically complementary value $\overline{a_2}$ thereof is effected using the logic transistors 129 to 132, so that equation (1) is clearly realized in terms of circuitry by means of the circuit from FIG. 1. This leads to an output signal y that can be provided at a global data signal output.

The logic basic cell 100 according to the invention thus makes it possible to realize functions with three inputs with a very small number of required transistors, an explicit multiplexer being dispensable. The principle that this small number of transistors makes possible consists in arranging the third (or in the generalized case any further switching variable) in the transistor series path in such a way that the input with the highest significance directly switches the output.

The circuit of the logic basic cell 100 is clearly subdivided into a first and a second p-channel transistor network 140, 150 and into a first and a second n-channel transistor network 160, 170. The first p-channel transistor network 140 and the first n-channel transistor network 160 together form a circuit which realizes any arbitrary function of two inputs according to the switch allocations of $s_0$ to $s_3$. If $a_2$ assumes a logic value "0", this function forms an output of the function of the three inputs. The second p-channel transistor network 150 and the second n-channel transistor network 170 together form a circuit which realizes any arbitrary function of two inputs according to the switch allocations $s_4$ to $s_7$. If $a_2$ assumes a logic value "1", this function forms the output of the function of three inputs. The Shannon decomposition of the function of three inputs in accordance with equation (1) is thus in turn realized. A functional unit fulfilling multiplexer functionality has been realized in the form of a c_(n−1)_MOS structure, where n is the number of inputs.

The table 200 shown in FIG. 2 specifies which logic subfunction $y_T$ is predetermined for the different permutations of the logic selection signals $s_0$ to $s_3$ for the example of the first logic function block 140 of the second data signal path 102 and for the first logic function block 160 of the first data signal path 101. By way of example, the data signals $a_0$ and $a_1$ are combined in accordance with an OR logic subfunction if the first logic selection signal $s_0$ has a logic value "1" and the second to fourth logic selection signals $s_1$ to $s_3$ in each case have a logic value "0".

Table 200 indicates the allocation of the switching variables $s_0$ to $s_3$ with the aid of which all possible 16 logic functions for combination of two data signals $a_0$ and $a_1$ can be set. More-significant more complex functions are constructed using equation (2) by virtue of a plurality of logic function blocks 140, 150, 160, 170 being connected to one another in the manner shown in FIG. 1, the influences of the third data signal $a_2$ being realized by means of the interconnected logic transistors 129 to 132 shown in FIG. 1.

A description is given below, with reference to FIG. 3, of a logic function block 300 in accordance with one exemplary embodiment, which can be implemented instead of the logic function blocks 140, 150, 160, 170 into a logic basic cell according to the invention (e.g. the logic basic cell 100 from FIG. 1) and can likewise fulfill an arbitrarily selectable logic subfunction.

Firstly, a description is given of the theoretical basis based on Boolean logic underlying the functionality of the logic function block 300 of the logic basic cell according to the invention.

Figure 3:
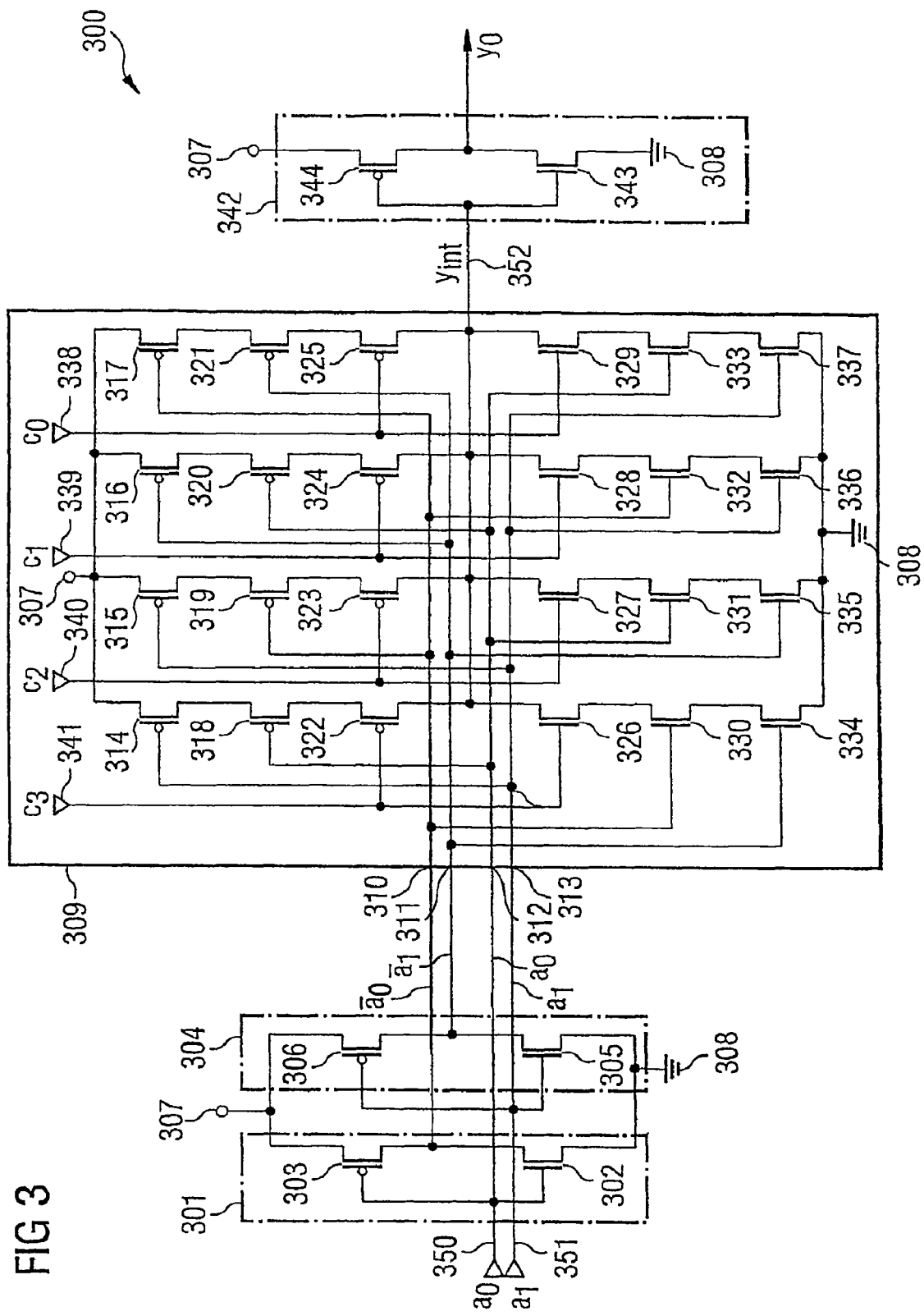
FIG. 3 shows a logic function block of a logic basic cell in accordance with one exemplary embodiment of the invention.

A Boolean function can be expressed in the canonical conjunctive normal form as an OR combination of the product terms of its n inputs (in FIG. 3 for example n=2 since two input signals $a_1$, $a_0$ are provided). These n inputs are assigned $2^n$ product terms.

Applied to standard CMOS logic, the product terms for the logic value "1" of a function are realized as a series path of p-channel transistors. The logic value "0" is correspondingly realized as a series path of n-channel transistors. Any logic function in accordance with which signals provided at n inputs are logically combined with one another can correspondingly be composed of $2^n$ product terms, clearly by product terms being connected in or out.

For two inputs $a_0$ and $a_1$, the following holds true:

$$y = k_0 \cdot \overline{a_1} \cdot \overline{a_0} \vee k_1 \cdot \overline{a_1} \cdot a_0 \vee k_2 \cdot a_1 \cdot \overline{a_0} \vee k_3 \cdot a_0 \cdot a_1 \quad (3)$$

$$\overline{y} = k_4 \cdot \overline{a_1} \cdot \overline{a_0} \vee k_5 \cdot \overline{a_1} \cdot a_0 \vee k_6 \cdot \overline{a_1 \cdot a_0} \vee k_7 \cdot \overline{a_1 \cdot a_0} \quad (4)$$

where $$k_i = \{0,1\} \text{ where } i=0,1,\ldots 7 \quad (5)$$

Each function $y=f(a_0, a_1)$ is formed by four values of the switching coefficients or logic function variables $k_0$ to $k_7$ being set to a value of logic "1" and the rest being set to a value of logic "0". Since in CMOS logic the p-channel transistors open with an electrical potential "0" at the control or gate terminal, whereas the n-channel transistors open in the case of an electrical potential having a value "1", the product terms in equations (3), (4) can be ordered to form mutually exclusive pairs. In equations (3), (4), the respective first product terms logically exclude one another, as do the respective second product terms, the respective third product terms and the respective fourth product terms.

The following relationship holds true for the switching coefficients $k_i$:

$$k_0 = \overline{k_4},\ k_1 = \overline{k_5},\ k_2 = \overline{k_6},\ k_3 = \overline{k_7} \quad (6)$$

The following results from equations (4), (5), (6) after combination to form four independent switching variables $c_0$, $c_1$, $c_2$, $c_3$:

$$y = \overline{c_0} \cdot \overline{a_1} \cdot \overline{a_0} \vee \overline{c_1} \cdot \overline{a_1} \cdot a_0 \vee \overline{c_2} \cdot a_1 \cdot \overline{a_0} \vee \overline{c_3} \cdot a_1 \cdot a_0 \quad (7)$$

$$\overline{y} = c_0 \cdot \overline{a_1 \cdot a_0} \vee c_1 \cdot \overline{a_1 \cdot a_0} \vee c_2 \cdot \overline{a_1 \cdot a_0} \vee c_3 \cdot \overline{a_1 \cdot a_0} \quad (8)$$

where $$c_i = \{0,1\} \text{ where } i=0,1,\ldots 3 \quad (9)$$

FIG. 3 shows a semiconductor-technological realization of the function in accordance with equations (7), (8) on the basis of transistors as a possible logic function block 140, 150, 160, 170 for a logic basic cell 100.

In the case of the logic function block 300 from FIG. 3, a first data signal $a_0$ is provided at a first data signal input 350. Furthermore, a second data signal $a_1$ is provided at a second data signal input 351. The complementary signal $\overline{a_0}$ with respect to the first data signal $a_0$ is formed from the latter by means of a first inverter circuit 301. The first data signal input 350 is coupled to the gate region of a first n-MOS inverter transistor 302. Furthermore, the first data signal input 350 is coupled to the gate terminal of a first p-MOS inverter transistor 303. A first source/drain region of the first p-MOS inverter transistor 303 is brought to the electrical supply potential 307. The second source/drain region of the first p-MOS inverter transistor 303 is coupled to a first source/drain region of the first n-MOS inverter transistor 302, the second source/drain region of which is brought to the electrical ground potential 308.

Furthermore, a second inverter circuit 304 is provided, by means of which the logically complementary signal $\overline{a_1}$ of the second data signal $a_1$ is formed from the latter. The second data signal input 351 is coupled to the gate terminals of a second n-MOS inverter transistor 305 and of a second p-MOS inverter transistor 306, which transistors 305, 306 form the second inverter circuit 304. A first source/drain region of the second p-MOS inverter transistor 306 is coupled to the first source/drain region of the first p-MOS inverter transistor 303, whereas the second source/drain terminal of the second p-MOS inverter transistor 306 is coupled to a first source/drain terminal of the second n-MOS inverter transistor 305. The second source/drain terminal of the second n-MOS inverter transistor 305 is brought to the electrical ground potential 308.

As shown in FIG. 3, the data signals and the logically complementary values thereof are provided to a signal path unit 309. The signal $\overline{a_0}$ is provided at a first signal path input 310. The signal $\overline{a_1}$ is provided at a second signal path input 311. The signal $a_0$ is provided at a third signal path input 312. The signal $a_1$ is provided at a fourth signal path input 313.

The signal path unit 309 is formed from first to twelfth p-MOS logic transistors 314 to 325 and from first to twelfth n-MOS logic transistors 326 to 337. The first to twelfth p-MOS logic transistors 314 to 325 form a first signal path subunit, whereas the first to twelfth n-MOS logic transistors 326 to 337 form a second signal path subunit.

A first logic function signal $c_0$ is applied to a first logic function input 338. A second logic function signal $c_1$ is provided at a second logic function input 339. A third logic function signal $c_2$ is provided at a third logic function input 340. A fourth logic function signal $c_3$ is provided at a fourth logic function input 341.

The fourth logic function input 341 is coupled to the gate terminal of the ninth p-MOS logic transistor 322 and to the gate terminal of the first n-MOS logic transistor 326. The third logic function input 340 is coupled to the gate terminals of the tenth p-MOS logic transistor 323 and of the second n-MOS logic transistor 327. The second logic function input 339 is coupled to the gate terminals of the eleventh p-MOS logic transistor 324 and of the third n-MOS logic transistor 328. The first logic function input 338 is coupled to the gate terminals of the twelfth p-MOS logic transistor 325 and of the fourth n-MOS logic transistor 329.

The first data signal input 310 is coupled to the gate terminal of the fifth n-MOS logic transistor 330, of the sixth p-MOS logic transistor 319, of the seventh n-MOS logic transistor 332 and of the fourth p-MOS logic transistor 317. The second data signal input 311 is coupled to the gate terminals of the ninth n-MOS logic transistor 334, of the tenth n-MOS logic transistor 335, of the third p-MOS logic transistor 316 and of the eighth p-MOS logic transistor 321. The third data signal input 312 is coupled to the gate terminals of the fifth p-MOS logic transistor 318, of the sixth n-MOS logic transistor 331, of the seventh p-MOS logic transistor 320 and of the eighth n-MOS logic transistor 333. The fourth data signal input 313 is coupled to the gate terminals of the first p-MOS logic transistor 314, of the second p-MOS logic transistor 315, of the eleventh n-MOS logic transistor 336 and of the twelfth n-MOS logic transistor 337.

First source/drain terminals of the first to fourth p-MOS logic transistors 314 to 317 are brought to the electrical potential of the supply voltage 307. The second source/drain terminal of the first p-MOS logic transistor 314 is coupled to a first source/drain terminal of the fifth p-MOS logic transistor 318, the second source/drain terminal of which is coupled to a first source/drain terminal of the ninth p-MOS logic transistor 322. The second source/drain terminal of the second p-MOS logic transistor 315 is coupled to a first source/drain terminal of the sixth p-MOS logic transistor 319, the second source/drain terminal of which is coupled to a first source/drain terminal of the tenth p-MOS logic transistor 323. The second source/drain terminal of the third p-MOS logic transistor 316 is coupled to a first source/drain terminal of the seventh p-MOS logic transistor 320, the second source/drain terminal of which is coupled to a first source/drain terminal of the eleventh p-MOS logic transistor 324. The second source/drain terminal of the fourth p-MOS logic transistor 317 is coupled to a first source/drain terminal of the eighth p-MOS logic transistor 321, the second source/drain terminal of which is coupled to a first source/drain terminal of the twelfth p-MOS logic transistor 325.

The second source/drain terminals of the ninth to twelfth p-MOS logic transistors 322 to 325 are coupled to the output 352 and to first source/drain terminals of the first to fourth n-MOS logic transistors 326 to 329. The second source/drain terminal of the first n-MOS logic transistor 326 is coupled to a first source/drain terminal of the fifth n-MOS logic transistor 330, the second source/drain terminal of which is coupled to a first source/drain terminal of the ninth n-MOS logic transistor 334. The second source/drain terminal of the second n-MOS logic transistor 327 is coupled to a first source/drain terminal of the sixth n-MOS logic transistor 331, the second source/drain terminal of which is coupled to a first source/drain terminal of the tenth n-MOS logic transistor 335. The second source/drain terminal of the third n-MOS logic transistor 328 is coupled to a first source/drain terminal of the seventh n-MOS logic transistor 332, the second source/drain terminal of which is coupled to a first source/drain terminal of the eleventh n-MOS logic transistor 336. Furthermore, the second source/drain terminal of the fourth n-MOS logic transistor 329 is coupled to a first source/drain terminal of the eighth n-MOS logic transistor 333, the second source/drain terminal of which is coupled to a first source/drain terminal of the twelfth n-MOS logic transistor 337. The second source/drain terminals of the ninth to twelfth n-MOS logic transistors 334 to 337 are coupled to one another and brought to the electrical ground potential 308.

The output signal $y_{int}$ is provided at a node 352.

The logic inverse $y_0$ is formed from the output signal $y_{int}$ at the node 352 using a third inverter circuit 342, and is provided at an output of the logic function block 300. The output signal $y_{int}$ is passed through the third inverter circuit 342, formed from a third n-MOS inverter transistor 343 and a third p-MOS inverter transistor 344. The output of the logic function block is coupled to the drain terminals of the transistors 344, 343. A first source/drain terminal of the third p-MOS inverter transistor 344 is brought to the electrical supply potential 307. The second source/drain terminal of the third p-MOS inverter transistor 344 is coupled to a first source/drain terminal of the third n-MOS inverter transistor 343, the second source/drain terminal of which is brought to the electrical ground potential 308. The second source/drain terminal of the third p-MOS inverter transistor 344 and the first source/drain terminal of the third n-MOS inverter transistor 343 are coupled to the output at which signal $y_0$ is present. The signal $y_0$ can be coupled into a logic transistor of the logic basic cell according to the invention.

The functionality of the logic function block 300 is described below.

The signal path unit 309 clearly implements the logic operations with the input signals $\overline{a_0}$, $\overline{a_1}$, $a_0$ and $a_1$. The functionality of equation (7) is clearly implemented by the p-MOS transistors 314 to 325 connected in the manner shown in FIG. 3, whereas the logic operation in accordance with equation (8) is clearly implemented by the n-MOS transistors 326 to 337. The two inverter circuits 301, 304 are provided between the data signal inputs 350, 351 and the signal path inputs 310 to 313 in order to generate the complementary signals $\overline{a_0}$, $\overline{a_1}$. The driving inverter circuit 342 is connected between output 352 and the global output 107a. In accordance with the exemplary embodiment described, the logic function block 300 having two inputs 350, 351 requires thirty transistors, namely the twelve p-MOS logic transistors 314 to 325, the twelve n-MOS logic transistors 326 to 337 and the six transistors 302, 303, 305, 306, 343, 344. The number of configuration bits or logic function signals is four ($c_0$, $c_1$, $c_2$, $c_3$).

It should be noted that, instead of four common logic function signals $c_0$ to $c_3$, as an alternative, it is also possible for the twelve p-MOS logic transistors 314 to 325 to be operated with four separate logic function signals and for the twelve n-MOS logic transistors 326 to 337 to be operated with four separate logic function signals that are different from $c_0$ to $c_3$.

A description is given below, with reference to FIG. 4, of a logic basic cell array 400 in accordance with a first exemplary embodiment of the invention.

The logic basic cell array 400 is formed from two essentially structurally identical subcircuits, namely a p-MOS subcircuit 410 and an n-MOS subcircuit 411. The p-MOS subcircuit 410 is constructed from p-MOS transistors, whereas the n-MOS subcircuit 411 is constructed from n-MOS transistors.

The p-MOS subcircuit 410 is formed from a first p-MOS logic basic cell 412 and from a second p-MOS logic basic cell 413. Each of the p-MOS logic basic cells 412, 413 has a first p-MOS logic function block 140 and a second p-MOS logic function block 150, which are coupled by means of the first p-MOS logic transistor 131 and the second p-MOS logic transistor 132 in such a way that a logic combination of three input signals $a_0$, $a_1$, $a_2$ is formed at a node 403 at an output of the first p-MOS logic basic cell 412. In a similar manner, a logic combination of the three data signals $a_0$, $a_1$, $a_2$ is provided at the node 403 at the output of the second p-MOS logic basic cell 413, the internal construction of which corresponds to that of the first p-MOS logic basic cell 412. Arranged at the output of the first p-MOS logic basic cell 412 is a third p-MOS logic transistor 401a, having a first source/drain terminal, to which the output signal of the first p-MOS logic basic cell 412 is applied, having a gate terminal, at which a fourth input signal $a_3$ is provided, and having a second source/drain terminal, at which the output signal y of the logic basic cell array 400 is provided.

Arranged at the output, that is to say at the node 403, of the second p-MOS logic basic cell 413 is a fourth p-MOS logic transistor 401b, having a first source/drain terminal, to which the output signal of the second p-MOS logic basic cell 413 is applied, having a gate terminal, at which a complementary signal $\overline{a_3}$ with respect to the fourth input signal $a_3$ is provided, and having a second source/drain terminal, which is coupled to the second source/drain terminal of the third p-MOS logic transistor 401a of the first p-MOS logic basic cell 412.

The construction of the n-MOS subcircuit 411 essentially corresponds to that of the p-MOS subcircuit 410 with the difference that the components contained therein are n-channel transistors rather than p-channel transistors as in the first p-MOS logic basic cell 412. A first logic function block 160 comprises n-MOS transistors and a second p-MOS logic function block 170 comprising p-MOS transistors are jointly connected to a first n-MOS logic transistor 129 and a second n-MOS logic transistor 130 in such a way that an output signal from three data signals $a_0$, $a_1$, $a_2$ is provided at a node 403 at the output of the first n-MOS logic basic cell 414. In a similar manner, an output signal from three data signals $a_0$, $a_1$, $a_2$ is provided at a node 403 at the output of the second n-MOS logic basic cell 415. By means of a third n-MOS logic transistor 402a at the output 403 of the first n-MOS logic basic cell 414 and by means of a fourth n-MOS logic transistor 402b at the output 403 of the second n-MOS logic basic cell 415, a global output signal y is generated at the output 404 of the logic basic cell array 400.

The third n-MOS logic transistor 402a has a first source/drain terminal to which the output signal of the first n-MOS logic basic cell 414 is applied, and the third n-MOS logic transistor 402a furthermore has a gate terminal, to which the complementary signal with respect to the fourth input signal $a_3$ is applied, and has a second source/drain terminal, at which the output signal y of the logic basic cell array 400 is provided. Furthermore, the second n-MOS logic transistor 402b has a first source/drain terminal, at which the output signal 403 of the second n-MOS logic basic cell 415 is provided, a gate terminal, at which the fourth input signal $a_3$ is provided, and a second source/drain terminal, which is coupled to the second source/drain terminal of the third n-MOS logic transistor 402a of the first n-MOS logic basic cell 414.

The functionality of the logic basic cell array 400 is described below.

At the outputs of the logic basic cells 412 to 415 a respective signal is provided in accordance with a logic subfunction realized by the respective logic basic cell 412 to 415, the signal representing a combination of two input signals $a_0$, $a_1$.

A logic partial output signal formed in accordance with equation (1) from three data signals $a_0$, $a_1$, $a_2$ is in each case provided at the nodes 403 coupled to the first source/drain terminals of the logic transistors 401a, 401b, 402a, 402b. A logic output signal y from four data input signals $a_0$, $a_1$, $a_2$, $a_3$ is provided at the global output 404 of the logic basic cell array 400, which corresponds to equation (2) for the case n=3.

Figure 4:
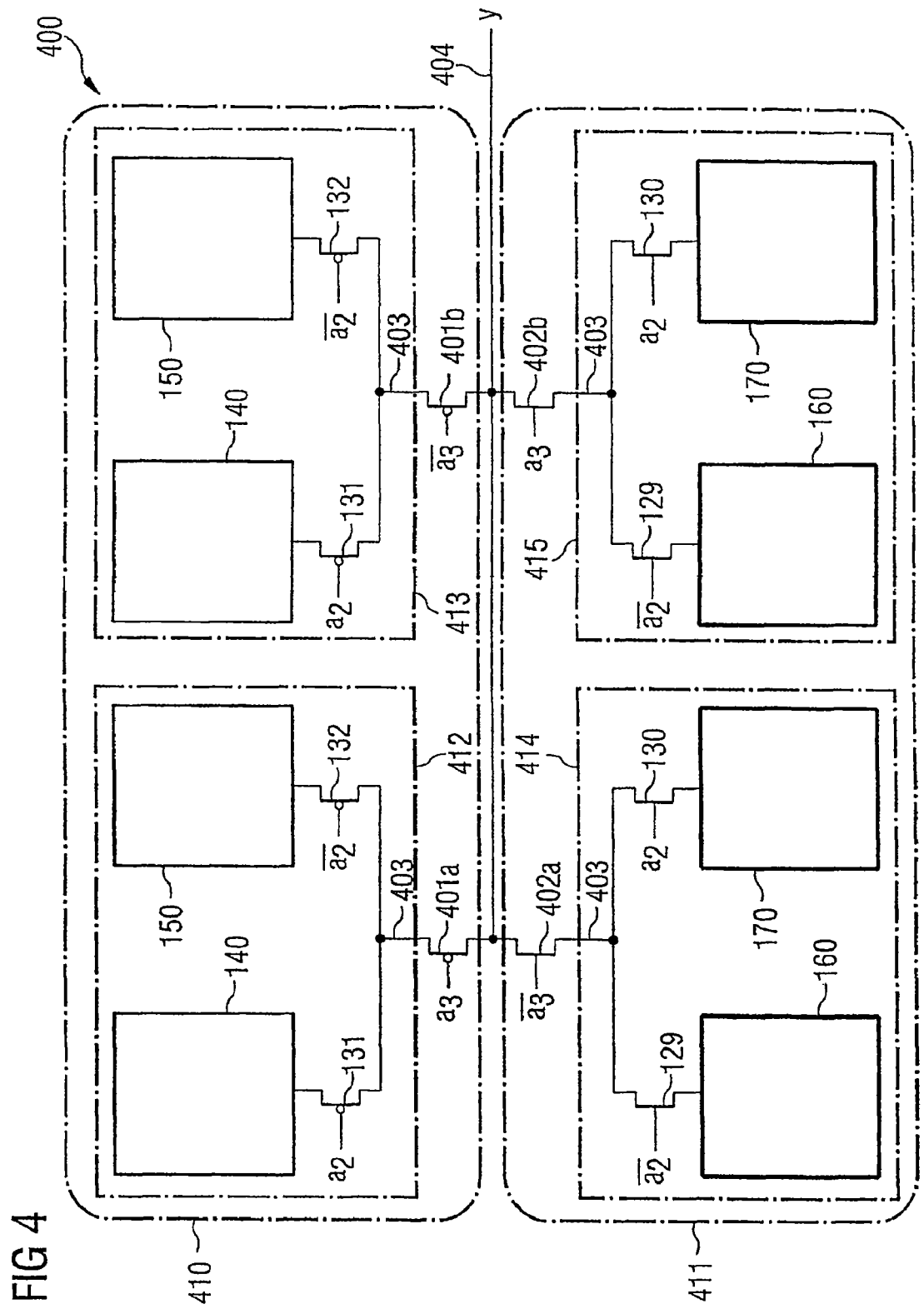
FIG. 4 shows a logic basic cell array in accordance with a first exemplary embodiment of the invention.

Consequently, according to the invention, it is possible to realize a function of more than three inputs (FIG. 4 shows a function of four inputs) with a structure as a binary tree. In the case of the binary tree from FIG. 4, the capacitive load at the global output 404 does not depend on the number of inputs. It always corresponds to the drain capacitance of the four transistors 401a, 401b, 402a, 402b present at the output 404.

A description is given below, with reference to FIG. 5, of a logic basic cell array 500 in accordance with a second exemplary embodiment of the invention.

In contrast to the logic basic cell array 400 from FIG. 4, the logic basic cell array 500 from FIG. 5 is not constructed using static CMOS logic, that is to say that FIG. 5 does not show a p-MOS path constructed essentially mirror-symmetrically with respect to an n-MOS path. The logic basic cell array 500 is formed only from a data signal path corresponding to the n-MOS subcircuit 411 from FIG. 4. Consequently, the internal construction of the n-MOS subcircuit 411 from FIG. 5 is essentially identical to that from FIG. 4. Consequently, in contrast to the logic basic cell array 400, the logic basic cell array 500 is provided with precisely one data signal path 411 comprising n-MOS field effect transistors, whereas the data signal path 410 comprising p-MOS field effect transistors as shown in FIG. 3 is obviated. This leads to a particularly space-saving arrangement.

An output signal representing the result of the processing of the data signals $a_0$, $a_1$, $a_2$, $a_3$ of the selected logic function is provided at a node 404 of the data signal path 411, which output is coupled to a first source/drain terminal of an n-MOS evaluation transistor 501. Given a corresponding signal at an evaluation input 503 coupled to the gate region of the evaluation transistor 501, the processed output signal is present at a global output 505 of the logic basic cell array 500, the output being coupled to the second source/drain region of the evaluation transistor 501. The second source/drain region of the evaluation transistor 501 is coupled to a first source/drain region of a p-MOS precharge transistor 502, the second source/drain region of which is brought to the electrical supply potential 127. Given a corresponding signal at a precharge input 504 coupled to the gate region of the precharge transistor 502, the electrical supply potential 127 is present as reference potential at the output 505 of the logic basic cell array 500, the output being coupled to the first source/drain region of the precharge transistor 502.

Consequently, compared with FIG. 4, the path comprising p-MOS transistors is obviated in FIG. 5. The pull-down network 411 is formed from n-MOS transistors in FIG. 5 as in FIG. 4, whereas in FIG. 5 the pull-up network 410 comprising p-MOS transistors is obviated and replaced by a statically or dynamically switched precharge transistor 502. As an alternative to FIG. 5, the signal path comprising n-MOS transistors in accordance with FIG. 4 may also be obviated and replaced by a precharge transistor, in which case a signal path comprising p-MOS transistors is provided.

Consequently, in the case of the non-static CMOS realization of the logic basic cell array 500 according to the invention in accordance with FIG. 5, a pull-up transistor 502 is provided, which precharges the output 505 to a logic value "1" in a partial interval of the switching time of the logic basic cell array 500 (precharge phase), whereas in the rest of the switching time the selected logic function is calculated in the pull-down path 411 realized according to the invention (evaluation phase).

All circuits which contain at least one of the two paths (pull-up or pull-down path) of the structure of FIG. 4 likewise constitute a logic basic cell or a logic basic cell array in the sense of the invention, irrespective of how the respective opposite logic potential is realized.

A description is given below, referring to FIG. 6A, FIG. 6B, of an alternative to the first and second n-MOS partial paths 101a, 101b and to the first and second p-MOS partial paths 102a, 102b of the logic basic cell 100 from FIG. 1.

In FIG. 1, the logic subfunction which is realized by the partial paths 101a, 101b, 102a, 102b is defined by means of predetermining logic function signals $s_0$ to $s_7$. As a result, specific paths within the transistor network are made conductive and other paths are excluded for the signal transport, so that the input signals $a_0$, $a_1$, $\overline{a_0}$, $\overline{a_1}$ provided at the inputs of the partial paths 101a, 101b, 102a, 102b are combined in accordance with the logic subfunction thereby selected.

Figure 6A:
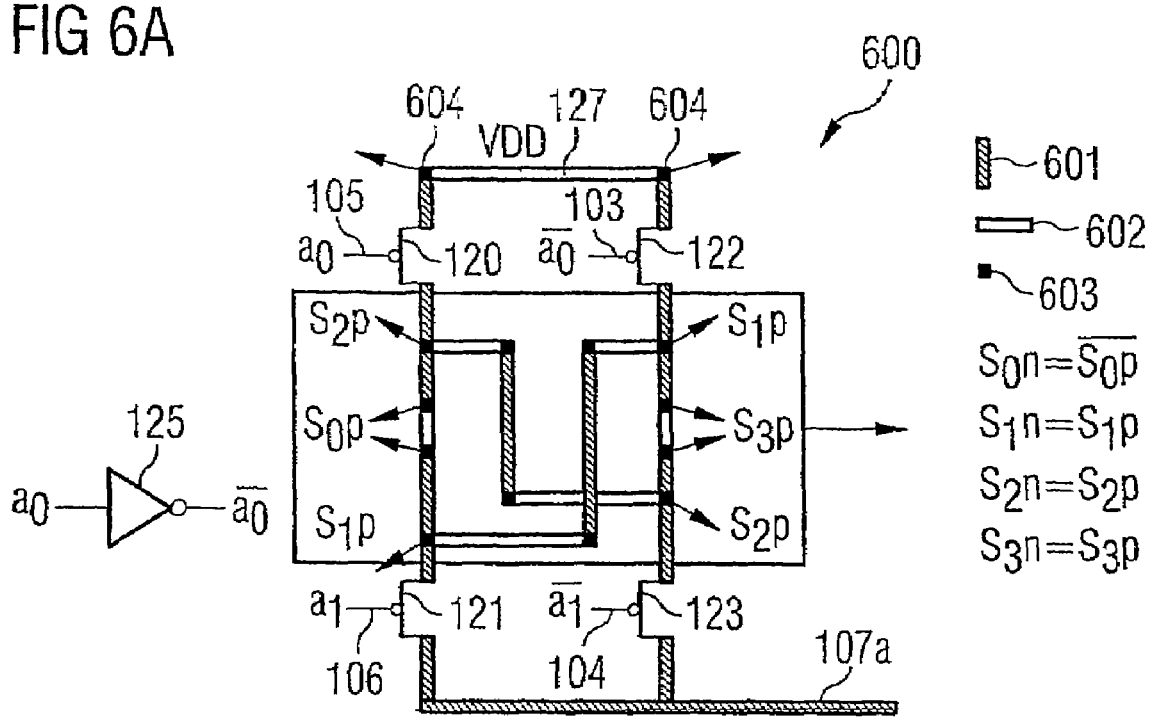
FIGS. 6A and 6B show a p-MOS partial path and an n-MOS partial path of a logic function block of a logic basic cell in accordance with one exemplary embodiment of the invention.
Figure 6B:
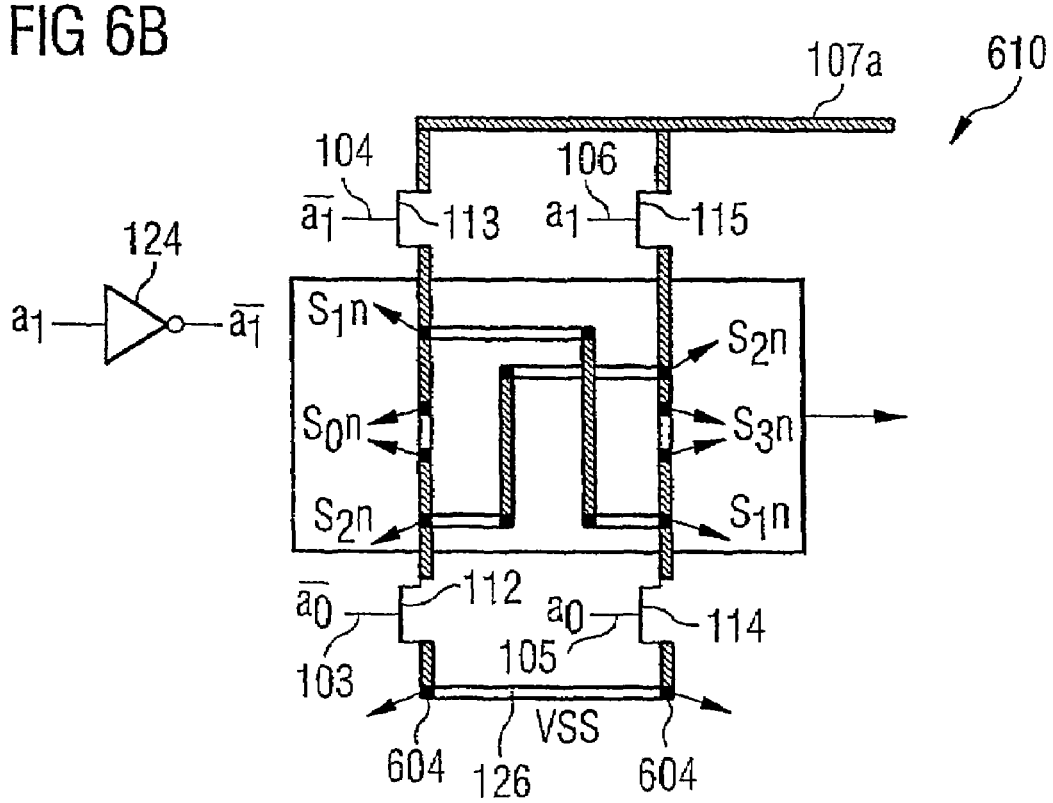

The p-MOS partial path 600 and the n-MOS partial path 610 shown in FIG. 6A and FIG. 6B, respectively, in each case constitutes a realization in which the logic subfunctions realized by the partial paths 600, 610 are predetermined by means of hardwiring. That is to say that the logic selection transistors from FIG. 1 are replaced by vias or metal bridges in FIG. 6A and FIG. 6B.

The p-MOS partial path 600 from FIG. 6A differs from the first and second p-MOS partial paths 102a, 102b from FIG. 1 by the fact that the logic selection transistors 116 to 119 are replaced by hardwired contact-making elements, formed from components 601 to 603. In a similar manner, the n-MOS partial path 610 from FIG. 6B differs from the first and second n-MOS partial paths 101a, 101b from FIG. 1 by the fact that the logic selection transistors 108 to 111 are replaced by hardwired contact-making elements, formed from components 601 to 603. The interconnection of the data signal transistors 120 to 123 and 112 to 115 in the p-MOS partial path 600 and in the n-MOS partial path 610, respectively, is fixedly predetermined in terms of hardware, that is to say by means of contact-making elements of a first metallization plane 601, of a second metallization plane 602 by means of vias 603. The vias 603 are formed such that they run perpendicular to the paper plane of FIG. 6A, FIG. 6B. The logic selection elements in FIG. 6A, FIG. 6B are provided as invariable hardware elements, realized by means of the metallization planes 601, 602 and the vias 603. The wiring of the data signal transistors 112 to 115 and 120 to 123 defines a logic function that is fixedly predetermined in each case. To put it another way, in FIG. 6A, FIG. 6B, configuration transistors 108 to 111 and 116 to 119 are replaced by via bridges $s_0p \ldots s_3p$ and $s_0n \ldots s_3n$, respectively. Furthermore, power vias 604 enable possibly omitted logic paths to be isolated from the supply voltage 127 VDD or from the ground potential VSS 126.

As an alternative, the switches between individual transistors in FIG. 6 may also be produced by all other via planes, any arbitrary metal layer, polysilicon, diffusion zones or by means of any other suitable plane of a present-day or future CMOS process. Within the standard CMOS circuitry, the realization from FIG. 6A, FIG. 6B is a particularly small and fast realization that is particularly favorable in terms of the power consumption.

In the realization from FIG. 6A, FIG. 6B in standard CMOS technology, two input inverters 124, 125 are used for generating the potentials $\overline{a_0}$, $\overline{a_1}$ from the data signals $a_0$ and $a_1$, respectively. It is possible to obviate the input inverters 124, 125 by means of n-channel transistors also being used in the pull-up path 600 and p-channel transistors also being used in the pull-down path 610. In order nevertheless to achieve a full voltage swing at an output, the voltage drops are compensated for by means of raising the supply potential or lowering the ground potential by a multiple of the threshold voltage $V_{th}$. In this case, however, the electrical loading capacity of the transistors must be taken into account when there are long series paths. Such a measure makes it possible to construct arrangements having an extremely high combinatorial packing density, a plurality of supply voltages being provided.

The invention's realization of the logic basic cell with an explicit multiplexer is an interesting variant particularly when the subfunctions $f_0$ and $f_1$ from equation (1) are to be provided for further use on the chip for other applications. If this is not the case, the decomposition according to the invention by means of a c_(n−1)_-MOS structure is a variant which can be realized compactly and which may possibly be limited in terms of the complexity that can be realized due to slightly increased delays on account of long transistor series paths. For very complex functions, a combination of the two approaches may represent the best solution. For combinatorial functions with more than six inputs, simplification possibilities arise since more than 16 functions of two inputs do not exist. In particular, a via-programmed solution makes it possible to utilize the advantages of the invention in an efficient manner.

The invention claimed is:

1. A logic basic cell for forming an output signal from at least three input signals in accordance with a predeterminable logic function, comprising:
    a first logic function block having two data signal inputs, to which a first input signal and a second input signal can be applied, and having a data signal output for providing a logic combination of the first input signal and the second input signal in accordance with a predeterminable first logic subfunction;
    a second logic function block having two data signal inputs, to which the first input signal and the second input signal can be applied, and having a data signal output for providing a logic combination of the first input signal and the second input signal in accordance with a predeterminable second logic subfunction;
    a first logic transistor having a first source/drain terminal, which is coupled to the data signal output of the first logic function block, having a gate terminal, at which a third input signal can be provided, and having a second source/drain terminal, at which the output signal can be provided; and
    a second logic transistor having a first source/drain terminal, which is coupled to the data signal output of the second logic function block, having a gate terminal, at which a complementary signal with respect to the third input signal can be provided, and having a second source/drain terminal, which is coupled to the second source/drain terminal of the first logic transistor.

2. The logic basic cell as claimed in claim 1, wherein the first logic function block and the second logic function block in each case have at least one additional data signal input, it being possible for an additional input signal to be applied to each of the additional data signal inputs, whereby the logic basic cell is set up for forming an output signal from at least four input signals in accordance with a predeterminable logic function.

3. The logic basic cell as claimed in claim 1, wherein the first logic function block and the second logic function block are each formed from a plurality of data signal transistors that are connected to one another in accordance with the respective logic subfunction.

4. The logic basic cell as claimed in claim 3, wherein:
the logic transistors and the data signal transistors are transistors of a first conduction type and form a first data signal path,
a second data signal path is formed from transistors of a second conduction type, which is complementary to the first conduction type, in which case, for each of the transistors of the first data signal path, a correspondingly connected transistor is provided in the second data signal path, and
the second source/drain terminals of the logic transistors of the first data signal path and the second source/drain terminals of the logic transistors of the second data signal path are coupled to one another.

5. The logic basic cell as claimed in claim 1, further comprising an evaluation switch, to which the output signal can be applied, and having a precharge switch, which switches are connected and can be controlled such that the output signal is provided at an output of the logic basic cell when the evaluation switch is open and the precharge switch is closed, and that a reference signal is provided at the output of the logic basic cell when the precharge switch is open and the evaluation switch is closed.

6. The logic basic cell as claimed in claim 5, wherein each of the evaluation switch and the precharge switch is a transistor.

7. The logic basic cell as claimed in claim 1, set up as a CMOS logic basic cell.

8. The logic basic cell as claimed in claim 1, wherein at least one of the logic function blocks is formed as a device selected from the group consisting of a programmable logic device, a field-programmable gate array, a mask-programmed application specific integrated circuit, a logic gate or arrangement of a plurality of logic gates, and a look-up table.

9. The logic basic cell as claimed in claim 1, wherein at least one of the logic function blocks has at least one logic function configuration input by means of which the logic subfunction that can be realized is predetermined in an invariable manner for the respective logic function block.

10. The logic basic cell as claimed in claim 9, further comprising a memory device which is coupled to the at least one logic function configuration input and in which the information for predetermining the logic subfunction that can be realized can be stored.

11. The logic basic cell as claimed in claim 1, wherein at least one of the logic function blocks has at least one logic function configuration input by means of which the logic subfunction that can be realized is predetermined in a variable manner for the respective logic function block by means of a signal that can be applied to the at least one logic function configuration input.

12. The logic basic cell as claimed in claim 1, wherein at least one of the logic function blocks furthermore comprises:
a first complementary data signal input, to which the logically complementary signal with respect to the first input signal can be applied;
a second complementary data signal input, to which the logically complementary signal with respect to the second input signal can be applied;
a first logic selection element between the first data signal input and the second data signal input;
a second logic selection element between the first data signal input and the second complementary data signal input;
a third logic selection element between the second data signal input and the first complementary data signal input; and
a fourth logic selection element between the first complementary data signal input and the second complementary data signal input,
wherein it is possible to provide, at the data signal output, the logic combination of the two data signals in accordance with the logic function selected by means of the logic selection elements.

13. The logic basic cell as claimed in claim 12, wherein the logic selection elements are invariable hardware elements.

14. The logic basic cell as claimed in claim 12, wherein the logic selection elements are realized by means of a plurality of metallization planes and/or by means of vias.

15. The logic basic cell as claimed in claim 14, wherein
the first logic selection element is a first logic transistor, which can be controlled by means of a first logic selection signal,
the second logic selection element is a second logic transistor, which can be controlled by means of a second logic selection signal,
the third logic selection element is a third logic transistor, which can be controlled by means of a third logic selection signal, and
the fourth logic selection element is a fourth logic transistor, which can be controlled by means of a fourth logic selection signal.

16. The logic basic cell as claimed in claim 12, further comprising four data signal transistors, at the gate terminals of which one of the data signals or one of the logically complementary data signals with respect to one of the data signals can be respectively provided.

17. The logic basic cell as claimed in claim 16, wherein a first data signal transistor is connected such that its
first source/drain terminal is coupled to a first source/drain terminal of the first logic transistor and to a first source/drain terminal of the second logic transistor, and
second source/drain terminal is coupled to a first source/drain terminal of a third data signal transistor.

18. The logic basic cell as claimed in claim 17, wherein the third data signal transistor is connected such that its second source/drain terminal is coupled to a first source/drain terminal of the fourth logic transistor and to a first source/drain terminal of the third logic transistor.

19. The logic basic cell as claimed in claim 16, wherein a second data signal transistor is connected such that its
first source/drain terminal is coupled to a second source/drain terminal of the first logic transistor and to a second source/drain terminal of the third logic transistor, and
second source/drain terminal is coupled to a first source/drain terminal of a fourth data signal transistor.

20. The logic basic cell as claimed in claim 19, wherein the fourth data signal transistor is connected such that its second source/drain terminal is coupled to a second source/drain terminal of the second logic transistor and to a second source/drain terminal of the fourth logic transistor.

21. A logic basic cell array for forming an arrangement output signal from at least four input signals in accordance with a predeterminable logic function, comprising:
a first logic basic cell as claimed in claim 1;
a third logic transistor having a first source/drain terminal, to which the output signal of the first logic basic cell can be applied, having a gate terminal, at which a fourth input signal can be provided, and having a second source/drain terminal, at which the output signal of the logic basic cell array can be provided;

a second logic basic cell as claimed in claim 1; and a fourth logic transistor having a first source/drain terminal, to which the output signal of the second logic basic cell can be applied, having a gate terminal, at which a complementary signal with respect to the fourth input signal can be provided, and having a second source/drain terminal, which is coupled to the second source/drain terminal of the third logic transistor.

22. A logic device for forming a logic combination of more than four data signals, comprising a plurality of logic basic cell arrays as claimed in claim 21.

* * * * *

UNITED STATES PATENT AND TRADEMARK OFFICE
CERTIFICATE OF CORRECTION

PATENT NO. : 7,432,736 B2
APPLICATION NO. : 10/598775
DATED : October 7, 2008
INVENTOR(S) : Joerg Gliese Page 1 of 1

It is certified that error appears in the above-identified patent and that said Letters Patent is hereby corrected as shown below:

Title page, item [75] "Jorg Gliese" should read -- Joerg Gliese, --

Please correct the Foreign Application Priority Data on the cover page, item (30):

"10 2004 011 433" should read -- 10 2004 011 433.1 --

In the Specification:

At column 4, line 15, "$f_0$" should read -- $f_1$ --

At column 13, line 14, "so" should read -- $s_0$ --

At column 13 (equation 3), line 48, "$k_2a_1$" should read -- $k_2 \cdot a_1$ --

At column 17, line 24, "$\overline{\alpha_3}$" should read -- $\overline{a_3}$ --

At column 19, line 18, "$\overline{a_0}$" should read -- $\overline{a_0}$ --

At column 28, line 18, "-MOS" should read -- MOS --

Signed and Sealed this

Thirteenth Day of January, 2009

JON W. DUDAS
*Director of the United States Patent and Trademark Office*